(12) United States Patent
Park

(10) Patent No.: US 7,924,649 B2
(45) Date of Patent: Apr. 12, 2011

(54) INTERNAL SOURCE VOLTAGE GENERATION CIRCUIT AND GENERATION METHOD THEREOF

(75) Inventor: Jae-Boum Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 90 days.

(21) Appl. No.: 12/492,604

(22) Filed: Jun. 26, 2009

(65) Prior Publication Data

US 2010/0277988 A1 Nov. 4, 2010

(30) Foreign Application Priority Data

Apr. 30, 2009 (KR) .................. 10-2009-0038529

(51) Int. Cl.
*G11C 7/00* (2006.01)

(52) U.S. Cl. .............. 365/226; 365/189.11; 365/189.15; 365/189.16; 365/193; 365/194

(58) Field of Classification Search ............ 365/189.11, 365/189.15, 189.16, 193, 194
See application file for complete search history.

(56) References Cited

U.S. PATENT DOCUMENTS

| 7,492,645 | B2 | 2/2009 | Kang et al. | |
|---|---|---|---|---|
| 7,492,646 | B2 | 2/2009 | Lee et al. | |
| 2005/0052909 | A1* | 3/2005 | Mochida | 365/191 |
| 2006/0002222 | A1* | 1/2006 | Lee | 365/226 |

FOREIGN PATENT DOCUMENTS

| JP | 10-079191 | 3/1998 |
|---|---|---|
| JP | 2003-196979 | 7/2003 |
| KR | 102006000092 | 1/2006 |

OTHER PUBLICATIONS

Notice of Allowance issued from Korean Intellectual Property Office on Nov. 30, 2011.

* cited by examiner

*Primary Examiner* — Hoai V Ho
(74) *Attorney, Agent, or Firm* — IP & T Group LLP

(57) ABSTRACT

An internal source voltage generation circuit includes main source voltage driving means configured to drive an internal source voltage terminal to a predetermined voltage level; and additional source voltage driving means configured to additionally drive the internal source voltage terminal in response to a data strobe signal.

18 Claims, 5 Drawing Sheets

INTERNAL SOURCE VOLTAGE GENERATION CIRCUIT AND GENERATION METHOD THEREOF

CROSS-REFERENCE TO RELATED APPLICATIONS

The present application claims priority of Korean Patent Application No. 10-2009-0038529, filed on Apr. 30, 2009, the disclosure of which is incorporated herein by reference in its entirety.

BACKGROUND OF THE INVENTION

The present invention relates to a semiconductor design technique, and more particularly, to an internal source voltage generation circuit and a generation method thereof.

An internal source voltage generation circuit may be mounted on a semiconductor memory device such as a Double Data Rate Synchronous Dynamic Random Access Memory (DDR SDRAM). The semiconductor memory device uses internal source voltages which are generated by the internal source voltage generation circuit and have various voltage levels, and may thus be ensured with efficient power consumption and stable circuit operations. The internal source voltages include a core source voltage and a peripheral source voltage which are generated by down-converting an external source voltage and a pumping source voltage and a substrate bias source voltage, which are generated by pumping the external source voltage and a ground source voltage. The internal structure of the semiconductor memory device is divided into a core region and a peripheral region. The core source voltage is a source voltage that is applied to a circuit located in the core region, and the peripheral source voltage is a source voltage that is applied to a circuit located in the peripheral region, hereinafter referred to as a peripheral circuit.

As semiconductor memory devices are becoming more highly integrated, manufacturing processes that allow them to have dimensions below a sub-micron level are being adopted when designing internal circuits, and at the same time, the operation frequencies of the semiconductor memory devices are gradually increasing. Also, in line with these changes in the semiconductor memory devices, the levels of external source voltages and internal source voltages used in the semiconductor memory devices are gradually decreasing. These changes may lead problems unseen in conventional semiconductor memory devices.

First, in a read operation of a semiconductor memory device, the data stored in a core region are transmitted to a pad through a global input/output line (GIO), which are produced in the semiconductor memory device and are then outputted to an outside, and in a write operation of the semiconductor memory device, the data inputted from the pad are transmitted to the core region through the global input/output line and are then stored. In other words, during the read and write operations of the semiconductor memory device, toggling operations occur on the global input/output line for transmitting data.

Since the global input/output line usually has a relatively large load, a circuit for driving the global input/output line should also have relatively large current driving capacity. Hereafter, for illustration purposes, a circuit for driving the global input/output line during the read operation of the semiconductor memory device is referred to as a 'read driving section', and a circuit for driving the global input/output line in the write operation of the semiconductor memory device is referred to as a 'write driving section'. The read driving section and the write driving section should have large current driving capacity in order to drive the global input/output line having a large load.

The read driving section and the write driving section are included in a peripheral circuit and drive the global input/output line by receiving a peripheral source voltage. Therefore, as the read driving section and the write driving section having large current driving capacity operate during the read and write operations, the peripheral source voltage applied thereto is likely to drop. If the peripheral source voltage drops, stable operations of the read driving section and the write driving section may not be ensured, which means that data may not be properly transmitted to the global input/output line. Furthermore, a problem occurs in that the reliability of the semiconductor memory device deteriorates.

SUMMARY OF THE INVENTION

An embodiment of the present invention is directed to providing an internal source voltage generation circuit which drives an additional source voltage to an internal source voltage terminal in response to a data strobe signal.

Another embodiment of the present invention is directed to providing a semiconductor memory device which drives an additional source voltage to a source voltage terminal of a circuit located in a peripheral region in response to a data strobe signal generated in response to a column command.

Another embodiment of the present invention is directed to providing a method for generating an internal source voltage which generates a driving control signal based on a delay that is determined based on an internal source voltage and an external source voltage, and generates an internal source voltage by driving an additional source voltage for an interval corresponding to the driving control signal.

In accordance with one aspect of the present invention, there is provided an internal source voltage generation circuit comprising main source voltage driving means configured to drive an internal source voltage terminal to a predetermined voltage level; and additional source voltage driving means configured to additionally drive the internal source voltage terminal in response to a data strobe signal.

In accordance with another aspect of the present invention, there is provided a semiconductor memory device comprising main source voltage driving means configured to drive a peripheral source voltage terminal for applying a source voltage to a peripheral circuit located in a peripheral region, to a predetermined voltage level; and additional source voltage driving means configured to additionally drive the peripheral source voltage terminal in response to a data strobe signal generated in response to a column command.

In accordance with another aspect of the present invention, there is provided a method for generating an internal source voltage, comprising driving an internal source voltage terminal with a source voltage; generating, in response to a data strobe signal, a driving control signal for a period that is determined based on a delay amount that is determined based on an internal source voltage and determined based on an additional source voltage; and additionally driving the internal source voltage terminal with the additional source voltage in response to the driving control signal.

In a conventional internal source voltage generation circuit, an internal source voltage having a predetermined voltage level is generated and used as a source voltage for driving a global input/output line in read and write operations. However, as the operation frequency of a semiconductor memory device increases and the voltage level of an internal source voltage decreases, when a read driving section and a write driving section operate, a problem occurs in that the internal source voltage drops. In the present invention, when the read driving section and the write driving section operate, additional power is driven to an internal source voltage terminal so that the phenomenon in which the internal source voltage drops is avoided.

DESCRIPTION OF SPECIFIC EMBODIMENT

Other objects and advantages of the present invention can be understood by the following description, and become apparent with reference to the embodiment of the present invention.

Figure 1:
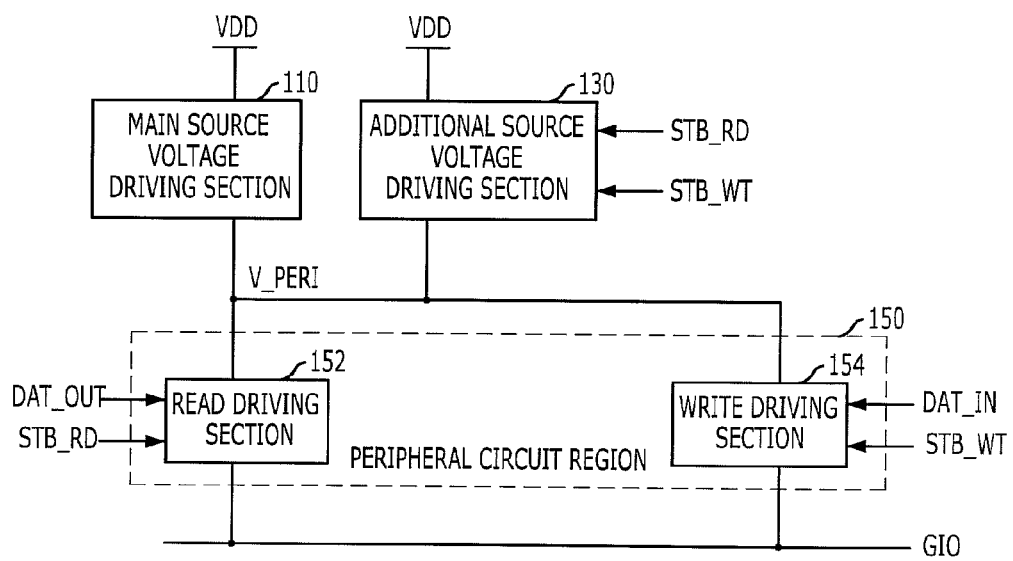
FIG. 1 is a block diagram illustrating a partial configuration of a semiconductor memory device in accordance with an embodiment of the present invention.

FIG. 1 is a block diagram illustrating a partial configuration of a semiconductor memory device in accordance with an embodiment of the present invention.

Referring to FIG. 1, a semiconductor memory device includes a main source voltage driving section 110, an additional source voltage driving section 130, and a read driving section 152 and a write driving section 154 which are located in a peripheral circuit region 150.

The main source voltage driving section 110 is configured to drive a peripheral source voltage V_PERI terminal, which applies a source voltage to a peripheral circuit located in a peripheral region, to a predetermined voltage level. The main source voltage driving section 110 is applied with an external source voltage VDD, down-converts the external source voltage VDD, and generates a peripheral source voltage V_PERI. That is to say, the main source voltage driving section 110 drives the peripheral source voltage V_PERI terminal with a source voltage.

The additional source voltage driving section 130 is configured to drive an additional source voltage to the peripheral source voltage (V_PERI) terminal in response to data strobe signals STB_RD and STB_WT. Hence, the peripheral source voltage V_PERI terminal according to the present invention is not only driven by the main source voltage driving section 110, but is also additionally driven by the additional source voltage driving section 130, which receives the external source voltage VDD, in response to the data strobe signals STB_RD and STB_WT (shown in FIG. 6).

The data strobe signals STB_RD and STB_WT includes a read data strobe signal STB_RD and a write data strobe signal STB_WT. The read data strobe signal STB_RD and the write data strobe signal STB_WT are signals for controlling times when data are driven to a global input/output line (GIO) serving as a data line during the read and write operations of the semiconductor memory device, and are generated in response to a column command. Namely, the read data strobe signal STB_RD and the write data strobe signal STB_WT are activated for an interval during which data are applied to the global input/output line.

Figure 8:
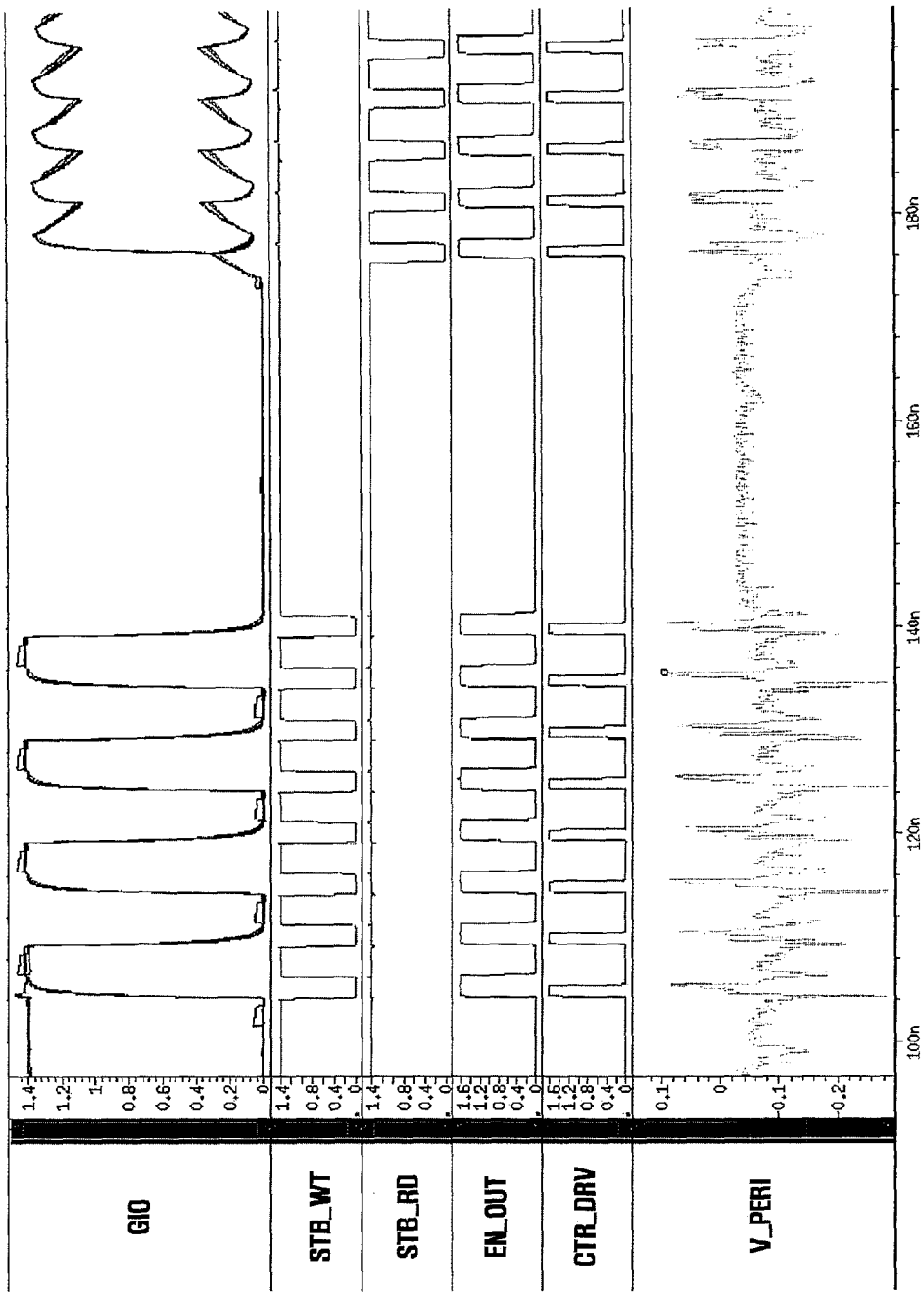
FIG. 8 is a waveform diagram showing operation waveforms of respective signals of FIG. 6.

The read driving section 152 and the write driving section 154, which are located in the peripheral circuit region 150, are applied with the peripheral source voltage V_PERI as a source voltage, and drive the global input/output line in response to the read data strobe signal STB_RD and the write data strobe signal STB_WT, respectively. The read data strobe signal STB_RD and the write data strobe signal STB_WT comprise pulse signals as shown in FIG. 8. The read driving section 152 transmits output data DAT_OUT to the global input/output line in response to the read data strobe signal STB_RD, and the write driving section 154 transmits input data DAT_IN to the global input/output line in response to the write data strobe signal STB_WT.

Figure 2:
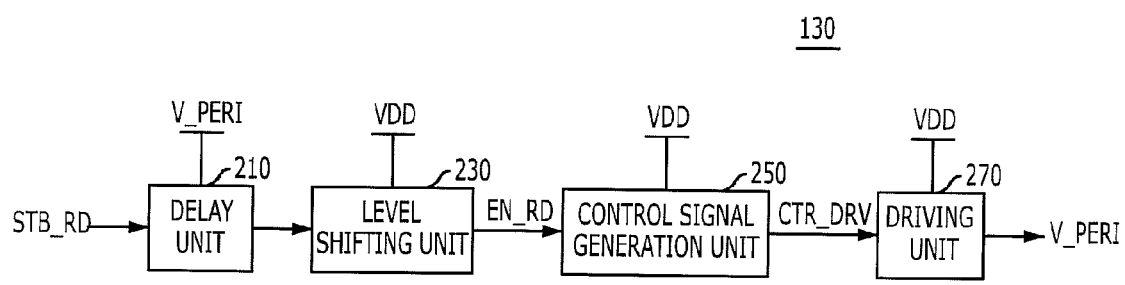
FIGS. 2 and 6 are block diagrams illustrating an additional source voltage driving section of FIG. 1.

FIG. 2 is a block diagram illustrating the additional source voltage driving section 130 of FIG. 1. For illustration purposes, only blocks associated with the read data strobe signal STB_RD are illustrated.

Referring to FIG. 2, the additional source voltage driving section 130 includes a delay unit 210, a level shifting unit 230, a control signal generation unit 250, and a driving unit 270.

The delay unit 210 outputs the read data strobe signal STB_RD by delaying it for a predetermined time. Since the delay unit 210 is applied with the peripheral source voltage V_PERI, the read data strobe signal STB_RD can be delayed for a time that is determined based on the peripheral source voltage V_PERI.

The level shifting unit 230 generates an activation signal EN_RD by level-shifting the output signal of the delay unit 210. Since the level shifting unit 230 is applied with the external source voltage VDD, the level shifting unit 230 can output the activation signal EN_RD by shifting the output signal of the delay unit 210, which is outputted with a voltage level of the peripheral source voltage V_PERI, to a voltage level of the external source voltage VDD.

Figure 3:
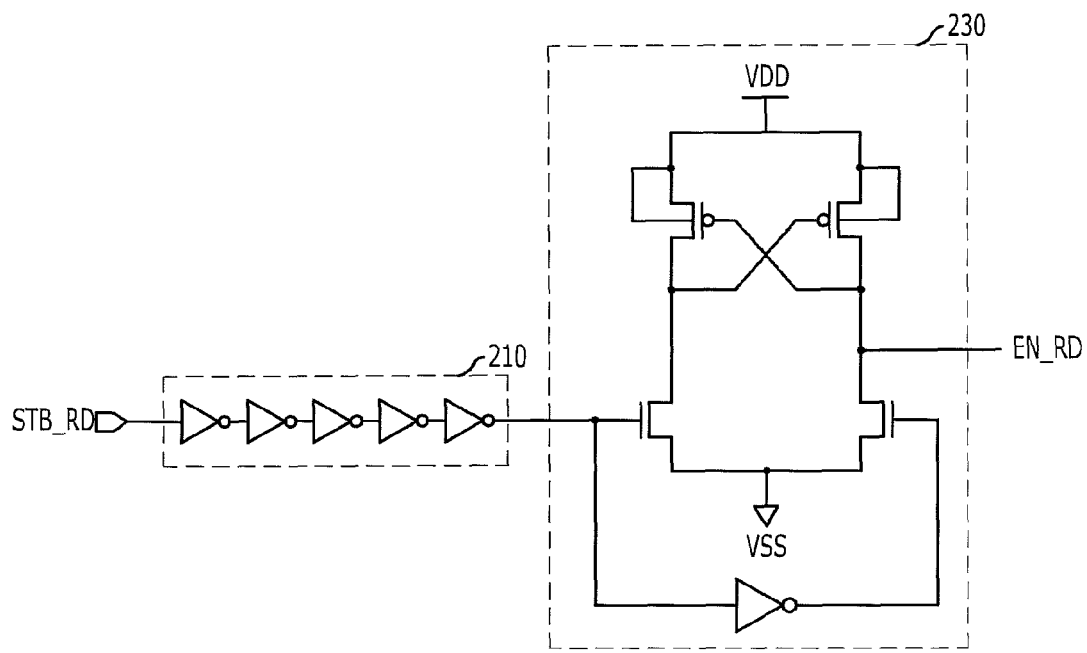
FIG. 3 is a circuit diagram illustrating a delay unit and a level shifting unit of FIG. 2.

FIG. 3 is a circuit diagram illustrating the delay unit 210 and the level shifting unit 230 of FIG. 2.

Referring to FIG. 3, the delay unit 210 has a plurality of inverters for receiving and delaying the read data strobe signal STB_RD. As described above with reference to FIG. 2, the plurality of inverters are applied with the peripheral source voltage V_PERI. The reason why the delay unit 210 receives the peripheral source voltage V_PERI as a supply voltage will be described with reference to FIG. 1.

Referring to FIG. 1, the additional source voltage driving section 130 according to the present invention additionally drives the peripheral source voltage V_PERI terminal whenever the read driving section 152 drives the global input/output line. Here, the time when the global input/output line toggles during the read operation is determined by the operation speed of the read driving section 152. The operation speed of the read driving section 152 is determined by the peripheral source voltage V_PERI, and according to this operation speed, the toggling time of the global input/output line is determined. Due to this fact, the additional source voltage driving section 130 should also operate in sync with the toggling time of the global input and output line.

As a consequence, in the present invention, by applying the peripheral source voltage V_PERI to the delay unit 210 and thereby delaying the read data strobe signal STB_RD, the time when the additional source voltage driving section 130 drives the peripheral source voltage V_PERI terminal can match the toggling time of the global input/output line. Therefore, the additional source voltage driving section 130 additionally drives the peripheral source voltage (V_PERI) terminal every time the global input/output line toggles. As will be described later in detail, a signal directly involved in the driving by an additional source voltage of the peripheral source voltage V_PERI terminal is a driving control signal CTR_DRV. The activation time of the driving control signal CTR_DRV is determined by the peripheral source voltage V_PERI applied to the delay unit 210 (see FIG. 2) after the read data strobe signal STB_RD is activated.

Referring again to FIG. 3, the level shifting unit 230 is applied with the external source voltage VDD and outputs the activation signal EN_RD through level shifting operation. That is to say, the output signal of the delay unit 210 has a voltage level of the peripheral source voltage V_PERI, and the activation signal EN_RD outputted from the level shifting unit 230 is outputted with a voltage level of the external source voltage VDD.

Referring again to FIG. 2, the control signal generation unit 250 is inputted with the activation signal EN_RD and generates the driving control signal CTR_DRV which is activated for a predetermined time interval. The control signal generation unit 250 operates by receiving the external source voltage VDD.

Figure 4:
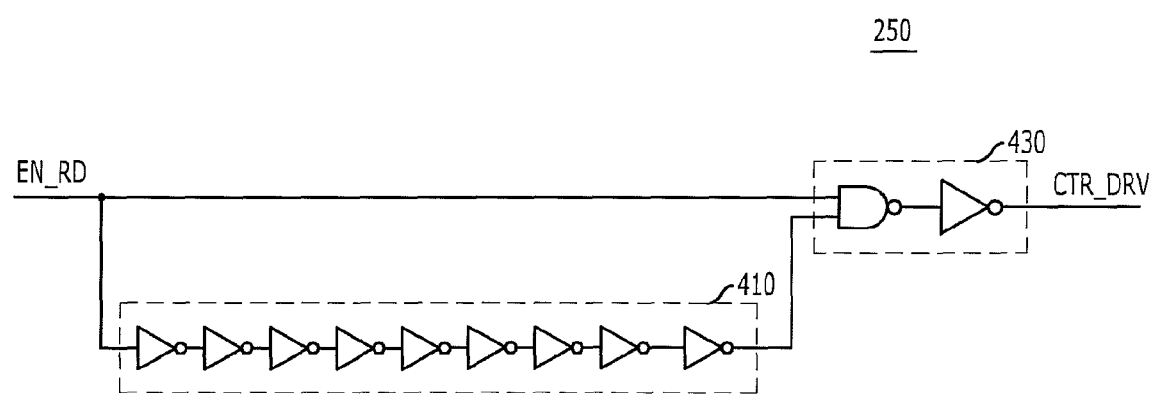
FIG. 4 is a circuit diagram illustrating a control signal generation unit of FIG. 2.

FIG. 4 is a circuit diagram illustrating the control signal generation unit 250 of FIG. 2.

Referring to FIG. 4, the control signal generation unit 250 includes a pulse delay part 410 and a pulse output part 430.

The pulse delay part 410 outputs the activation signal EN_RD by delaying it by a certain time, and comprises a plurality of inverters. As described above, since the pulse delay part 410 is applied with the external source voltage VDD, the certain time that is determined based on the external source voltage VDD can be reflected at the activation signal EN_RD.

The pulse output part 430 outputs the driving control signal CTR_DRV in response to the activation signal EN_RD and the output signal of the pulse delay part 410. The driving control signal CTR_DRV comprises a pulse type signal. The pulse width of the driving control signal CTR_DRV is determined by the delay time of the pulse delay part 410. Namely, the pulse width of the driving control signal CTR_DRV is determined due to the delay that is dependent on the external source voltage VDD.

Referring again to FIG. 2, the driving unit 270 drives the peripheral source voltage V_PERI terminal in response to the driving control signal CTR_DRV. The driving unit 270 operates by receiving the external source voltage VDD.

Figure 5:
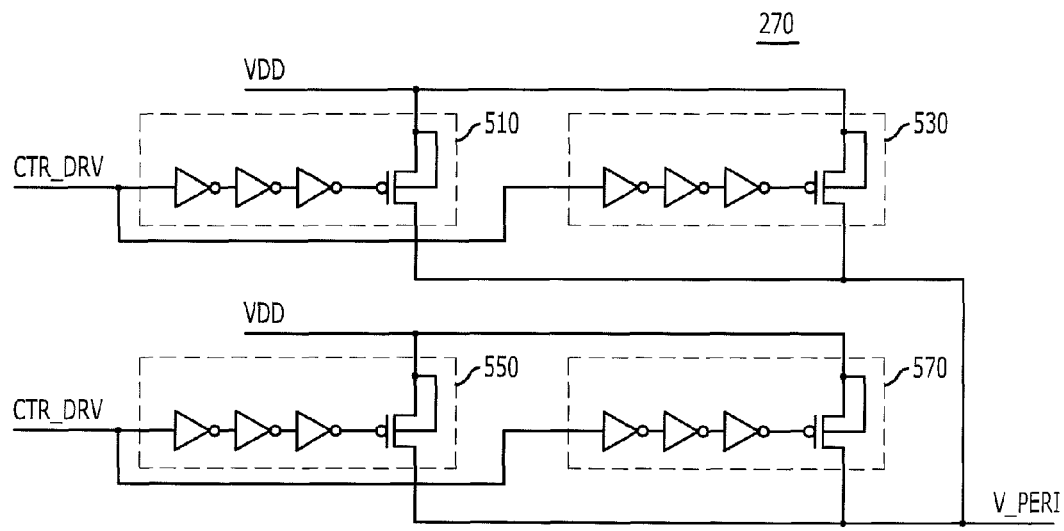
FIG. 5 is a circuit diagram illustrating a driving unit of FIG. 2.

FIG. 5 is a circuit diagram illustrating the driving unit 270 of FIG. 2.

Referring to FIG. 5, the driving unit 270 includes first through fourth driving parts 510, 530, 550 and 570. The respective first through fourth driving parts 510, 530, 550 and 570 are driven to additionally supply the external source voltage VDD to the peripheral source voltage V_PERI terminal in response to the driving control signal CTR_DRV. That is to say, the first through fourth driving parts 510, 530, 550 and 570 can connect the peripheral source voltage V_PERI terminal and an external source voltage (VDD) terminal for a time that is determined based on the pulse width of the driving control signal CTR_DRV.

In other words, the driving unit 270 drives the external source voltage VDD to the peripheral source voltage V_PERI terminal for the time that is determined based on the pulse width of the driving control signal CTR_DRV. As described above, the driving control signal CTR_DRV is activated at a time that is determined based on the peripheral source voltage V_PERI after the read data strobe signal STB_RD is activated (that is, the time that EN_RD is activated), and is inactivated at a time that is determined based on the external source voltage VDD (that is, due to the delay time determined via 410). The activation time of the driving control signal CTR_DRV corresponds to the toggling time of the global input/output line in response to the peripheral source voltage V_PERI, and the inactivation time of the driving control signal CTR_DRV is determined based on the external source voltage VDD. In other words, if the external source voltage VDD is high, the inactivation time of the driving control signal CTR_DRV is shortened, and if the external source voltage VDD is low, the inactivation time of the driving control signal CTR_DRV is extended.

As a result, the internal source voltage generation circuit according to the present invention additionally drives the external source voltage VDD to the peripheral source voltage V_PERI terminal whenever the read driving section 152 (see FIG. 1) drives the global input/output line in response to the read data strobe signal STB_RD, and thus, it is possible to avoid the problem caused in the conventional art due to the fact that the peripheral source voltage V_PERI drops.

Figure 6:
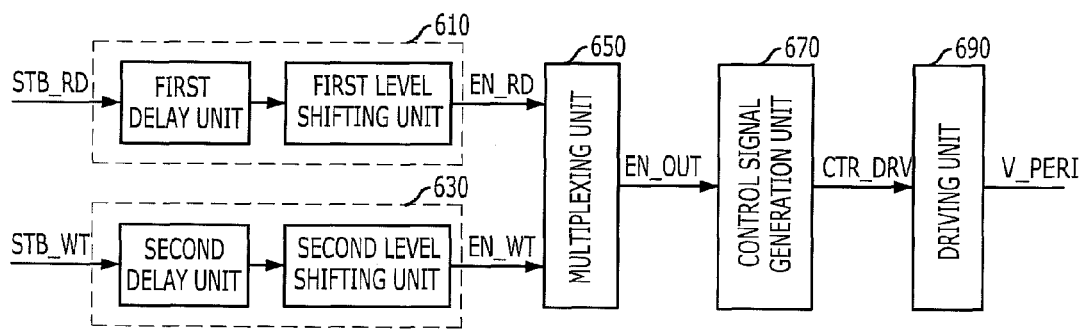

FIG. 6 is a block diagram illustrating the additional source voltage driving section 130 of FIG. 1. Blocks associated with the read data strobe signal STB_RD and the write data strobe signal STB_WT are illustrated in FIG. 6. Comparing FIGS. 6 and 2, the delay unit 210 and the level shifting unit 230 of FIG. 2 correspond to a first delay unit and a first level shifting unit. In FIG. 6, the first delay unit and the first level shifting unit associated with the read data strobe signal STB_RD form a first activation signal generation unit 610, and a second delay unit and a second level shifting unit associated with the write data strobe signal STB_WT form a second activation signal generation unit 630.

Thus, the first activation signal generation unit 610 generates a first activation signal EN_RD that is activated in response to the read data strobe signal STB_RD, and the second activation signal generation unit 630 generates a second activation signal EN_WT that is activated in response to the write data strobe signal STB_WT. Here, it is preferred that the activation intervals of the read data strobe signal STB_RD and the write data strobe signal STB_WT do not overlap with each other. Also, it is preferred that the first delay unit reflects a time to be delayed according to the design of the read driving section 152 (see FIG. 1) and the second delay unit reflects a time to be delayed according to the design of the write driving section 154.

A multiplexing unit 650 inputs the first or second activation signal EN_RD or EN_WT to a control signal generation unit 670. Before explaining the multiplexing unit 650, it is mentioned first that the control signal generation unit 670 and a driving unit 690 have circuit configurations and perform circuit operations similar to the control signal generation unit 250 and the driving unit 270 of FIG. 2.

Figure 7:
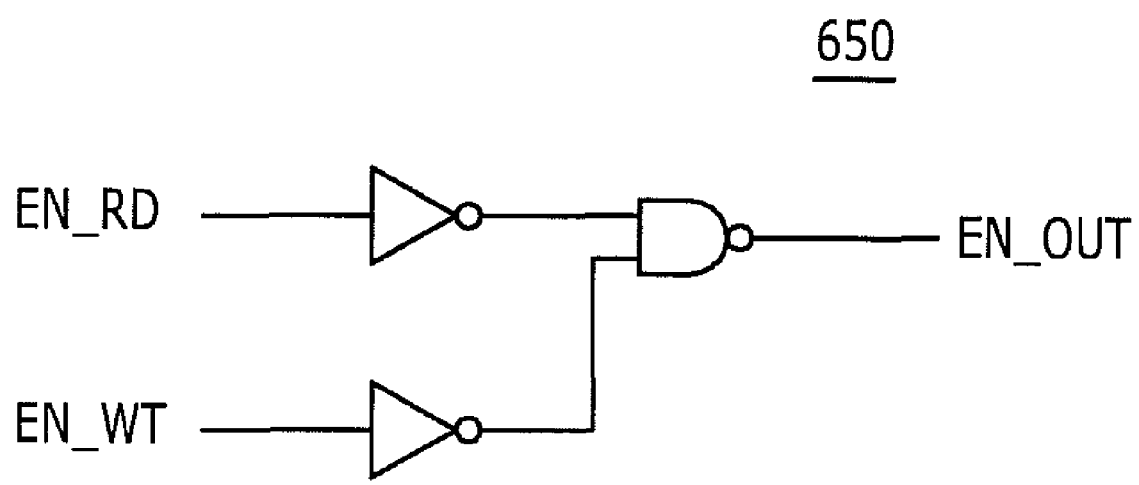
FIG. 7 is a circuit diagram illustrating a multiplexing unit of FIG. 6.

FIG. 7 is a circuit diagram illustrating the multiplexing unit 650 of FIG. 6.

Referring to FIG. 7, the multiplexing unit 650 includes inverters for receiving the first and second activation signals EN_RD and EN_WT, and a NAND gate for receiving the output signals of the respective inverters and outputting an output activation signal EN_OUT. For reference, the first and second activation signals EN_RD and EN_WT are pulse signals which are activated to a logic 'high', and the output activation signal EN_OUT is a pulse signal which corresponds to the activation interval of the logic 'high' of the first and second activation signals EN_RD and EN_WT.

FIG. 8 is a waveform diagram showing operation waveforms of respective signals of FIG. 6. The current waveforms of the global input/output line (GIO), the write data strobe signal STB_WT, the read data strobe signal STB_RD, the output activation signal EN_OUT, the driving control signal CTR_DRV, and the peripheral source voltage V_PERI terminal are shown in FIG. 8.

Referring to FIG. 8, the data on the global input/output line toggle in response to the write data strobe signal STB_WT and the read data strobe signal STB_RD. At this time, the driving control signal CTR_DRV according to the present invention is activated for an interval that is determined based on the peripheral source voltage V_PERI and the external source voltage VDD after the read and write data strobe signals STB_RD and STB_WT are activated. The driving control signal CTR_DRV generated in this way is activated each time data toggle on the global input/output line, and in the foregoing manner, the peripheral source voltage V_PERI terminal and the external source voltage (VDD) terminal are connected. As a result, this operation enables an additional driver to supply the external voltage to the peripheral source voltage V_PERI terminal, whereby it is possible to avoid the problem caused in the conventional art due to dropping of the peripheral source voltage V_PERI.

While it was exemplarily described in the above embodiment that the driving unit 270 shown in FIG. 2 is composed of the first through fourth driving parts 510, 530, 550 and 570 shown in FIG. 5, it is to be understood that the number of driving parts can be changed depending upon a design without departing from the present invention. Moreover, in the above-described embodiment, the positions and types of logic gates and transistors may be differently implemented depending upon the polarities of signals.

As is apparent from the above description, in the present invention, an occurrence in which an internal source voltage drops is prevented, whereby reliable data transmission can be ensured and the reliability of a semiconductor memory device can be improved.

While the present invention has been described with respect to the specific embodiment, it will be apparent to those skilled in the art that various changes and modifications may be made without departing from the spirit and scope of the invention as defined in the following claims.

What is claimed is:

1. A semiconductor memory device, comprising:
   main source voltage driving means configured to drive a peripheral source voltage terminal, which applies a source voltage to a peripheral circuit located in a peripheral region; and
   additional source voltage driving means configured to additionally drive the peripheral source voltage terminal in response to a data strobe signal.

2. The semiconductor memory device of claim 1, wherein the peripheral circuit includes:
   a read driving section applied with a peripheral source voltage and configured to drive a data line in response to a read data strobe signal in a read operation; and
   a write driving section applied with the peripheral source voltage and configured to drive the data line in response to a write data strobe signal in a write operation.

3. The semiconductor memory device of claim 1, wherein the additional source voltage driving means is activated in an interval that is determined based on the peripheral source voltage and an external source voltage received by the additional source voltage driving means.

4. The semiconductor memory device of claim 1, wherein the additional source voltage driving means comprises:
   a delay unit configured to delay the data strobe signal;
   a level shifting unit configured to level-shift an output signal of the delay unit;
   a control signal generation unit configured to be inputted with an output signal of the level shifting unit and generate a driving control signal that is activated for a predetermined time interval; and
   a driving unit configured to drive the peripheral source voltage terminal in response to the driving control signal.

5. The semiconductor memory device of claim 4, wherein the delay unit determines the predetermined time interval based on the peripheral source voltage.

6. The semiconductor memory device of claim 4, wherein the level shifting unit level-shifts the output signal of the delay unit to a voltage level of the external source voltage.

7. The semiconductor memory device of claim 4, wherein control signal generation unit comprises:
   a pulse delay part configured to delay the output signal of the level shifting unit by a time that is determined based on the external source voltage; and
   a pulse output part configured to output the driving control signal in response to the output signal of the level shifting unit and an output signal of the pulse delay part.

8. The semiconductor memory device of claim 7, wherein the pulse delay part is inputted with the external source voltage and reflects the time that is determined based on the predetermined time interval in correspondence to the external source voltage.

9. The semiconductor memory device of claim 7, wherein the driving control signal is activated at a time that is determined based on the peripheral source voltage applied to the delay unit and is inactivated at a time that is determined based on the external source voltage applied to the pulse delay part.

10. The semiconductor memory device of claim 2, wherein the data strobe signal is activated for an interval during which data are applied to the data line.

11. The semiconductor memory device of claim 2, wherein the additional source voltage driving means comprises:
   a first activation signal generation unit configured to generate a first activation signal that is activated in response to the read data strobe signal;
   a second activation signal generation unit configured to generate a second activation signal that is activated in response to the write data strobe signal;
   a control signal generation unit configured to be inputted with the first or second activation signal and generate a driving control signal that is activated for the predetermined interval time interval; and
   a driving unit configured to drive the peripheral source voltage terminal in response to the driving control signal.

12. The semiconductor memory device of claim 11, wherein the additional source voltage driving means comprises:
   a multiplexing unit configured to input the first or second activation signal to the control signal generation unit.

13. The semiconductor memory device of claim 2, wherein the read data strobe signal is activated for an interval during which data are inputted, and the write data strobe signal is activated for an interval during which data are outputted.

14. A method for generating an internal source voltage, comprising:
   driving an internal source voltage terminal with a source voltage;
   generating, in response to a data strobe signal, a driving control signal for a period that is determined based on a delay amount that is determined based on an internal source voltage and determined based on an additional source voltage; and additionally driving the internal source voltage terminal with the additional source voltage in response to the driving control signal.

15. The method of claim 14, wherein the additional source voltage is an external source voltage.

16. The method of claim 14, wherein the data strobe signal is generated in response to a column command.

17. The method of claim 14, wherein generating the driving control signal comprises:

generating a first output signal by delaying the data strobe signal by a time that is determined based on the internal source voltage;

generating a second output signal by delaying the delayed data strobe signal by a time that is determined based on the additional source voltage; and outputting the driving control signal in response to the first and second output signals.

18. The method of claim 14, wherein the driving control signal is activated, after an activation time of the data strobe signal, at an activation time that is determined based on the internal source voltage and an inactivation time that is determined based on the additional source voltage.

* * * * *

UNITED STATES PATENT AND TRADEMARK OFFICE
CERTIFICATE OF CORRECTION

PATENT NO. : 7,924,649 B2  
APPLICATION NO. : 12/492604  
DATED : April 12, 2011  
INVENTOR(S) : Jae-Boum Park Page 1 of 1

It is certified that error appears in the above-identified patent and that said Letters Patent is hereby corrected as shown below:

Change FOREIGN PATENT DOCUMENTS and OTHER PUBLICATIONS portions of section (56) for References Cited as follows:

FOREIGN PATENT DOCUMENTS

JP   10-079191         3/1998  
JP   2003-196979       7/2003  
KR   1020060000922     1/2006

OTHER PUBLICATIONS  
Notice of Allowance issued from Korean Intellectual Property Office on November 30, 2010.

Signed and Sealed this  
Twenty-fourth Day of May, 2011

David J. Kappos  
*Director of the United States Patent and Trademark Office*